US009196318B2

(12) United States Patent
Peng et al.

(10) Patent No.: US 9,196,318 B2
(45) Date of Patent: Nov. 24, 2015

(54) LOW TEMPERATURE DRIFT VOLTAGE REFERENCE CIRCUIT

(71) Applicant: Shanghai SIM-BCD Semiconductor Manufacturing Co., Ltd., Shanghai (CN)

(72) Inventors: Shaohua Peng, Shanghai (CN); Zutao Liu, Shanghai (CN)

(73) Assignee: Shanghai SIM-BCD Semiconductor Manufacturing CO., LTd., Shanghai (CN)

( * ) Notice: Subject to any disclaimer, the term of this patent is extended or adjusted under 35 U.S.C. 154(b) by 191 days.

(21) Appl. No.: 14/052,425

(22) Filed: Oct. 11, 2013

(65) Prior Publication Data

US 2014/0104964 A1 Apr. 17, 2014

(30) Foreign Application Priority Data

Oct. 11, 2012 (CN) .......................... 2012 1 0385231

(51) Int. Cl.
*H03K 17/14* (2006.01)
*G11C 5/14* (2006.01)
*G11C 7/04* (2006.01)

(52) U.S. Cl.
CPC . *G11C 5/147* (2013.01); *G11C 7/04* (2013.01)

(58) Field of Classification Search
USPC .......................................................... 327/378
See application file for complete search history.

(56) References Cited

U.S. PATENT DOCUMENTS 4,386,286 A * 5/1983 Kuo ................................ 326/83
5,034,628 A * 7/1991 Matsuzawa et al. .......... 326/109
6,552,603 B2 * 4/2003 Ueda ............................ 327/541
2003/0223271 A1 * 12/2003 Byeon et al. ............. 365/185.18

FOREIGN PATENT DOCUMENTS

CN 101840240 A 9/2010

OTHER PUBLICATIONS

China Intellectual Property Office office action for application CN201210385231.X dated Dec. 9, 2013.

* cited by examiner

*Primary Examiner* — Lincoln Donovan
*Assistant Examiner* — Patrick Chen

(57) ABSTRACT

A voltage reference circuit includes a first enhancement-mode PMOS transistor, a first enhancement mode NMOS transistor, and a first depletion-mode PMOS transistor coupled in series between a voltage supply and a ground. A second depletion-mode PMOS transistor is coupled to the first enhancement PMOS transistor to form a feedback circuit. A first resistive device is coupled between the voltage supply and the second depletion-mode PMOS transistor, and a second resistive device is coupled between the second depletion-mode PMOS transistor and the ground. A bias circuit is coupled to a gate of the first enhancement-mode NMOS transistor. The first enhancement-mode PMOS transistor and the first depletion-mode PMOS transistor are configured to operate in saturation region. A first reference voltage across the first resistor and a second reference voltage across the second resistor are configured to be independent of the magnitude of the voltage supply and have low temperature drift.

21 Claims, 3 Drawing Sheets

LOW TEMPERATURE DRIFT VOLTAGE REFERENCE CIRCUIT

CROSS-REFERENCES TO RELATED APPLICATIONS

This application claims priority to Chinese Patent Application No: 201210385231.X, filed Oct. 11, 2012, commonly owned and incorporated by reference herein for all purposes.

BACKGROUND OF THE INVENTION

The present invention relates to the technical field of electronic circuits. More particularly, embodiments of the present invention relate to adjustable voltage reference circuits having low temperature drift.

In electronic circuits, a voltage reference is an electronic device that ideally produces a fixed voltage irrespective of operating conditions, such as power supply variations and temperature changes. Voltage references are used in power management integrated circuit chips, analog-to-digital converters and digital-to-analog converters, and other measurement and control systems. The voltage reference often can determine the performance of power management integrated circuit chips. A reference voltage source can be implemented in a wide variety of ways, for example, bandgap reference voltage source, bandgap reference with second-order temperature compensation, Zener-based reference voltage source, and E/D (Enhancement/Depletion) reference voltage source, etc.

FIG. 1 shows an example of a convention E/D NMOS reference voltage circuit, in which a depletion-mode NMOS transistor M1 and an enhancement-mode NMOS transistor M2 are connected in series. The voltage at the common node between M1 and M2 is fed to a source follower depletion-mode NMOS transistor M3. The output voltage is determined by the combination of depletion-mode NMOS transistor M4 and enhancement-mode transistor M5.

BRIEF SUMMARY OF THE INVENTION

The inventors have observed that conventional E/D voltage reference circuits have many drawbacks. For example, the reference voltage provided by the circuit of FIG. 1 usually falls in a very narrow range centered around, e.g., 0.85 V, and it is difficult to make adjustment to obtain a different reference voltage. In addition, forming depletion-mode NMOS transistors would need to add an extra masking step to a standard integrated circuit manufacturing process, thus increasing process complexity and cost. In contrast, in embodiments of the present invention, the voltage reference circuits use depletion-mode PMOS transistors, which can be fabricated using standard CMOS process technology, and the threshold implant step for the depletion mode PMOS transistors can share the same mask and be carried out at the same time as the implant step for high value resistors. No extra masking step is needed. In embodiments of the invention, the voltage reference circuit is configured to operate in a large supply voltage range, which enables a large range of adjustable reference voltages. For example, a bias circuit is provided to maintain a depletion-mode PMOS transistor in the saturation region with a large Vds even under a low voltage supply. A feedback circuit is provided to maintain an enhancement-mode PMOS transistor in the saturation region even under a low voltage supply. For example, the voltage reference circuit according to some embodiments of the invention can operate with a supply voltage source of between 2V to 5V, greatly expanding its scope of application. In addition, the reference voltage can be adjusted in a wide range by varying the ratio of two high-value resistors.

According to an embodiment of the present invention, a voltage reference circuit includes a first enhancement-mode PMOS transistor, a first enhancement mode NMOS transistor, and a first depletion-mode PMOS transistor coupled in series between a voltage supply and a ground. The voltage reference circuit also includes a first resistive device, a feedback device, and a second resistive device coupled in series between the voltage supply and the ground. The feedback device is coupled to the first enhancement PMOS transistor to form a feedback circuit. A bias circuit is coupled to a gate of the first enhancement-mode NMOS transistor. The first enhancement-mode PMOS transistor and the first depletion-mode PMOS transistor are configured to operate in saturation region. A first reference voltage across the first resistive device and a second reference voltage across the second resistive device are configured to be independent of voltage supply variations and can have low temperature drift.

According to another embodiment of the present invention, a voltage reference circuit includes a first enhancement-mode PMOS transistor, a first enhancement mode NMOS transistor, and a first depletion-mode PMOS transistor coupled in series between a voltage supply and a ground. The first depletion-mode PMOS transistor has shorted gate and source. A second depletion-mode PMOS transistor having a source coupled to the gate of the first enhancement PMOS transistor at a first node. The second depletion-mode PMOS transistor also has a gate coupled to a drain of the first enhancement-mode PMOS transistor at a second node, forming a feedback circuit. A first resistive device is coupled between the voltage supply and the first node, and a second resistive device has one end coupled to the drain of the second depletion-mode PMOS transistor at a third node and has the other end coupled to the ground. A bias circuit coupled to a gate of the first enhancement-mode NMOS transistor. The first enhancement-mode PMOS transistor and the first depletion-mode PMOS transistor are configured to operate in saturation region, and a first reference voltage between the voltage supply and the first node is independent of the magnitude of the voltage supply.

In another embodiment of the above voltage reference circuit, the first enhancement-mode PMOS transistor has a source coupled to the voltage supply. The first enhancement-mode NMOS transistor has a drain coupled to the drain of the first enhancement-mode PMOS transistor at the second node. The first depletion-mode PMOS transistor has a source and a gate coupled to a fourth node, the fourth node further coupled to a source of the first enhancement-mode NMOS transistor.

In an embodiment of the above voltage reference circuit, the bias circuit includes a third depletion-mode PMOS transistor, a second enhancement-mode NMOS transistor, and a third enhancement-mode NMOS transistor coupled in series between the voltage supply and the ground. The third depletion-mode PMOS transistor has shorted gate and source coupled to the voltage supply. The second enhancement-mode NMOS transistor has a gate and a drain coupled the drain of the third depletion-mode PMOS transistor at a fifth node. The third enhancement-mode NMOS transistor has a drain and a gate coupled to a source of third enhancement-mode NMOS transistor and the ground at a sixth node.

In another embodiment of the above voltage reference circuit, the first reference voltage is a function of only threshold voltages, gate widths, and gate lengths of the first enhancement-mode PMOS transistor and the first depletion-mode PMOS transistor. In an embodiment, the first reference voltage Vo1 is expressed by the following equation:

$$Vo1 = V_{thE} + \sqrt{\frac{W_D \times L_E}{W_E \times L_D}} \times V_{thD}$$

where:

VthE is the threshold voltage of the first enhancement-mode PMOS transistor,

VthD is the threshold voltage of the first depletion-mode PMOS transistor, $W_E$ and $L_E$ are the gate width and gate length, respectively, of the enhancement-mode PMOS transistor; and $W_D$ and $L_D$ are the gate width and gate length, respectively, of first depletion-mode PMOS transistor.

In another embodiment, the gate widths and the gate lengths of the first enhancement-mode PMOS transistor and the first depletion-mode PMOS transistor have values such that the negative temperature coefficient of the threshold voltage of the enhancement-mode PMOS transistor and the positive temperature coefficient of the threshold voltage of the depletion-mode PMOS transistor substantially are compensated, and such that the temperature coefficient of the first reference voltage is within a preset limit.

In another embodiment of the above voltage reference circuit a second reference voltage between the third node and the ground is independent of the magnitude of the voltage supply. In an embodiment, a ratio of the second reference voltage and the first reference voltage is equal to a ratio of the resistance values of the first resistive device and the second resistive device. In an embodiment, substrates of the first, the second, and the third depletion-mode PMOS transistors are coupled to the voltage supply, and substrates of the first, the second, and the third enhancement-mode NMOS transistors are coupled to the ground.

A further understanding of the nature and advantages of the present invention may be realized by reference to the remaining portions of the specification and the drawings.

DETAILED DESCRIPTION OF THE INVENTION

Figure 1:
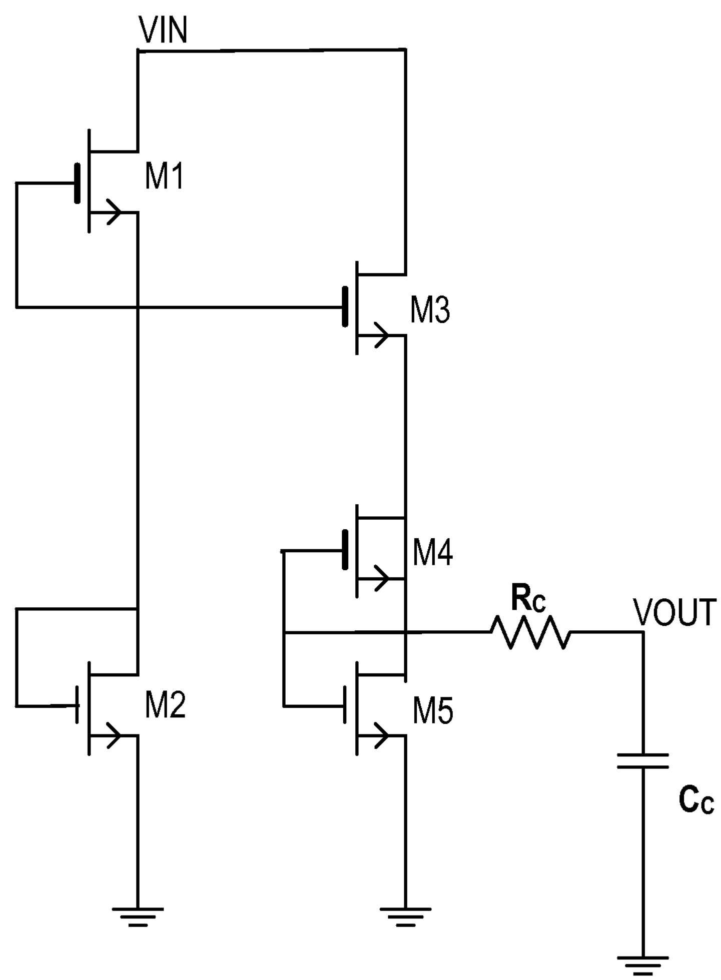
FIG. 1 is a schematic circuit diagram illustrating a conventional voltage reference circuit.
Figure 2:
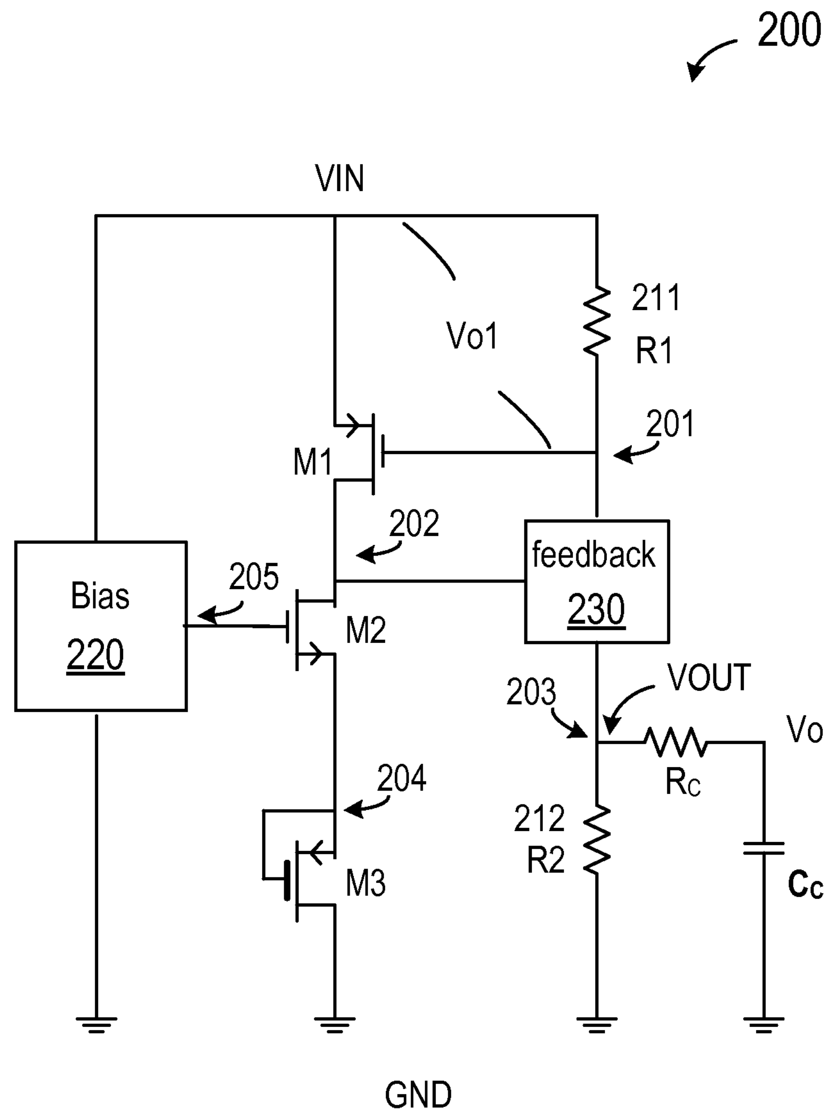
FIG. 2 is a schematic circuit diagram illustrating a voltage reference circuit according to an embodiment of the present invention.

FIG. 2 is a schematic circuit diagram illustrating a voltage reference circuit 200 according to an embodiment of the present invention. As shown in FIG. 2, voltage reference circuit 200 includes a first enhancement-mode PMOS transistor M1, a first enhancement mode NMOS transistor M2, and a first depletion-mode PMOS transistor M3 coupled in series between a voltage supply VIN and a ground GND. The first depletion-mode PMOS transistor M3 has shorted gate and source. Voltage reference circuit 200 also includes a feedback device 230 coupled to a gate of the first enhancement PMOS transistor M1 at a first node 201. The feedback device is also coupled to a drain of the first enhancement-mode PMOS transistor M1 at a second node 202, forming a feedback circuit. A first resistive device 211 is coupled between the voltage supply VIN and the first node 201. A second resistive device 212 has one end coupled to the feedback device 230 at a third node 203, and has the other end coupled to the ground GND. A bias circuit 220 is coupled to a gate of the first enhancement-mode NMOS transistor M2. The voltage reference circuit is configured to provide a first reference voltage Vo1 between the voltage supply VIN at the first node 201, and a second reference voltage the third node 203 and the ground GND.

As shown in FIG. 2, feedback device 230 and the first enhancement PMOS transistor M1 form a negative feedback circuit. The negative feedback circuit is configured to stabilize the voltage reference circuit. The negative feedback circuit and the bias circuit are configured to bias the first enhancement-mode PMOS transistor M1 and the first depletion-mode PMOS transistor M3 to operate in saturation region. In embodiments of the invention, the first and the second reference voltages are independent of the voltage supply. Further, temperature coefficients of the first reference voltage can be set within a preset limit. An example of the voltage reference circuit with exemplary embodiments of the bias circuit and feedback device is described below with reference to FIG. 3.

Figure 3:
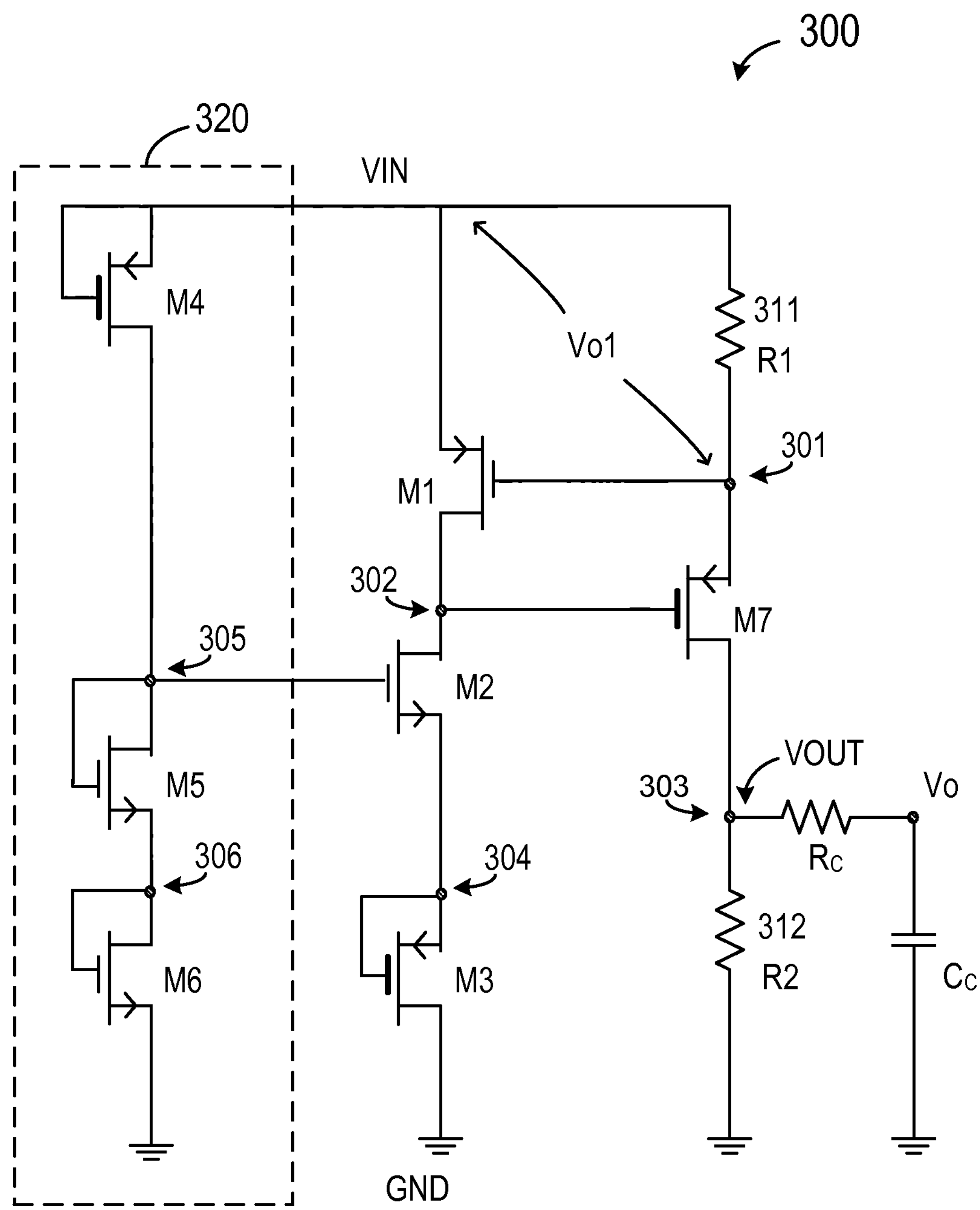
FIG. 3 is a schematic circuit diagram illustrating a voltage reference circuit according to another embodiment of the present invention.

FIG. 3 is a circuit diagram of a voltage reference circuit 300 according to an embodiment of the present invention. As shown in FIG. 3, voltage reference circuit 300 includes a first enhancement-mode PMOS transistor M1, a first enhancement mode NMOS M2 transistor, and a first depletion-mode PMOS transistor M3 coupled in series between a voltage supply VIN and a ground GND. Voltage reference circuit 300 also includes a second depletion-mode PMOS transistor M7 having a source coupled to the gate of the first enhancement PMOS transistor M1 at a first node 301. Second depletion-mode PMOS transistor M7 also has a gate coupled to the drain of the first enhancement PMOS transistor M1 at a second node 302, forming a feedback circuit. A first resistive device 311, with resistance value R1, is coupled between the voltage supply VIN and the first node 301. A second resistive device 312, with resistance value R2, has one end coupled to the drain of the second depletion-mode PMOS transistor M7 at a third node 303 and the other end coupled to the ground GND. Voltage reference circuit 300 also includes a bias circuit 320 coupled to a gate of the first enhancement-mode NMOS transistor at a fifth node 305. More specifically, the first enhancement-mode PMOS transistor M1 has a source coupled to the voltage supply VIN. The first enhancement-mode NMOS transistor M2 has a drain coupled to a drain of the first enhancement-mode PMOS transistor M2 at a first node 301. Further, the first depletion-mode PMOS transistor M3 has source, a gate, and substrate coupled together at a fourth node 304. The fourth node 304 is further coupled to a source of the first enhancement-mode NMOS transistor M2.

As described below, the first enhancement-mode PMOS transistor M1 and the first depletion-mode PMOS transistor M3 are configured to operate in saturation region. The first depletion-mode PMOS transistor M3 is configured as a constant current source, having fixed gate-to-source voltage Vgs. Its gate-to-source voltage Vgs is zero, because it has shorted gate and source. Further, the bias circuit 320 is configured to provide a constant bias voltage at node 305, resulting in a constant Vds in the first depletion-mode PMOS transistor M3. The constant current flows through the first enhancement PMOS transistor M1, leading to a constant gate-to-source voltage, which is independent of the voltage supply and can be used as a reference voltage. In FIG. 3, this voltage is shown as a first reference voltage Vo1 between the voltage supply VIN and the first node 301. As explained below, the first reference voltage is a function of only threshold voltages, gate widths, and gate lengths of the first enhancement-mode PMOS transistor M1 and the first depletion-mode PMOS transistor M3. Therefore, the gate widths and the gate lengths of the first enhancement-mode PMOS transistor M1 and the first depletion-mode PMOS transistor M3 can be selected such that the negative temperature coefficient of the threshold voltage of the enhancement-mode PMOS transistor and the positive temperature coefficient of the threshold voltage of the depletion-mode PMOS transistor substantially can compensate each other, and such that the temperature coefficient of the first reference voltage is within a preset limit. Moreover, a second reference voltage is provided at the third node 303, and the value of a second reference voltage can be adjusted by varying the ratio of R1 and R2, where R1 and R2 are the resistance values of the first and the second resistive devices 311 and 312, respectively.

In some embodiments of the invention, the first and the second resistive devices 311 and 312 are high value resistors, which can be fabricated using standard CMOS process technology. The threshold implant step for the depletion mode PMOS transistors can share the same mask and be carried out at the same time as the implant step for the high value resistors.

As shown in FIG. 3, bias circuit 320 includes a third depletion-mode PMOS transistor M4, a second enhancement-mode NMOS transistor M5, and a third enhancement-mode NMOS transistor coupled in series between voltage supply VIN and ground GND. The third depletion-mode PMOS transistor M4 has a gate, a source, and a substrate coupled to the voltage supply VIN. The second enhancement-mode NMOS transistor M5 has a gate and a drain coupled the drain of the third depletion-mode PMOS transistor M4 at a fifth node 305. The substrate of the second enhancement-mode NMOS transistor M5 is coupled to the ground. The third enhancement-mode NMOS transistor M6 has a drain and a gate coupled to a source of third enhancement-mode NMOS transistor M5 at a sixth node 306. A source and a substrate of the third enhancement-mode NMOS transistor M6 are coupled to the ground GND.

In FIG. 3, bias circuit 320 includes a third depletion-mode PMOS transistor M4, a second enhancement-mode NMOS transistor M5 and a third enhancement-mode NMOS transistor M6 coupled in series between voltage supply VIN and ground GND. Bias circuit 320 is configured to operate when voltage supply VIN is equal to or greater than 2V DC. As shown in FIG. 3, the third depletion-mode PMOS transistor M4 has shorted gate and source, i.e., Vgs=0. The gate, source, and substrate of M4 are connected to voltage supply VIN. Therefore, M4 is configured as a current source. The second enhancement-mode NMOS transistor M5 and the third enhancement-mode NMOS transistor both have shorted gate and drain, i.e., Vgd=0. The substrates of M5 and M6 are connected to the ground GND. The voltage at node 305 is equal to the sum of the gate-to-source voltage Vgs of NMOS transistors M5 and M6. Node 305 is the output terminal for bias circuit 320 providing a bias voltage to the gate of M2.

As shown in FIG. 3, first enhancement mode NMOS M2 transistor is couple to first enhancement-mode PMOS transistor M1 and first depletion-mode PMOS transistor M3. MOS transistors M1, M2, and M3 are coupled in series between voltage supply VIN and ground GND. In the following description, first enhancement-mode PMOS transistor M1 is characterized by a threshold voltage VthE, a channel width WE, and a channel length LE. Similarly, first depletion-mode PMOS transistor M3 has a threshold voltage VthD, a channel width WD, and a channel length LD. As can be seen in FIG. 3, the drain-to-source voltage Vds of M3 is equal to the sum of the Vgs of M5 and M6 minus the Vgs of M2. As an example, M2, M5, and M6 are all NMOS transistors which may have Vgs of about 0.8 V in some embodiments. Therefore, Vds of M3 is approximately 0.8 V. As a result, first depletion-mode PMOS transistor M3 will operate in the saturation region if Vgs3−Vth3≤Vds3. Since Vgs for M3 is zero, the saturation condition is satisfied if −Vth≤Vds. In other words, M3 is configured to operate in saturation region, if −Vth≤0.8 V in these embodiments. In some embodiments, the threshold voltage of first depiction-mode PMOS transistor M3 may be about −0.4V. Therefore, the drain current Idd of M3 can be expressed as follows.

$$I_{dd} = \frac{1}{2} \times \mu_p \times C_{ox} \times \frac{W_D}{L_D} \times (Vgs3 - V_{thD})^2 \tag{1}$$

In the above equation, Idd is the drain current flowing through the PMOS transistor M3, $\mu_p$ is the hole mobility, Cox is the gate oxide capacitance per unit area, WD is the the channel width, LD is the channel length, Vgs3 is the gate-to-source voltage, and VthD is the threshold voltage of the depletion-mode PMOS transistor M3.

Similarly, first enhancement-mode PMOS transistor M1 is also configured to operate in the saturation region. As shown in FIG. 3, second depletion-mode PMOS transistor M7 has a source coupled to the gate of the first enhancement PMOS transistor M1 at a first node 301. Second depletion-mode PMOS transistor M7 also has a gate coupled to the drain of the first enhancement PMOS transistor M1 at a second node 302, forming a feedback circuit. The negative feedback circuit is configured to stabilize the circuit and is also configured to provide proper bias for the first enhancement-mode PMOS transistor M1 to operate in saturation region. As a result, the drain-to-source voltage of M1, Vds1 is equal to the sum of Vgs1 and Vgs7, where Vgs1 and Vgs7 are the gate-to-source voltage of M1 and M7, respectively. It can be shown that Vds1=Vgs+Vgs7. In some embodiments, depletion-mode PMOS transistor M7 may have a threshold voltage of about 400 mV and a Vgs is about 250 mV. Enhancement-mode PMOS transistor M1 may have a threshold voltage of about 800 mV. Thus, the relationship Vgs—Vth≤Vds is satisfied with M1. Therefore, enhancement-mode PMOS transistor M1 is configured to operate in saturation region, and the drain current Idd of M1 can be expressed as follows.

$$I_{dd} = \frac{1}{2} \times \mu_p \times C_{ox} \times \frac{W_E}{L_E} \times (Vgs1 - V_{thE})^2 \tag{2}$$

In the above equation, Idd is the drain current flowing through enhancement-mode PMOS transistor M1, $\mu_p$ is the hole mobility, Cox is the gate oxide capacitance per unit area, WE is the channel width, LE is the channel length, Vgs1 is the gate-to-source voltage for enhancement-mode PMOS transistor M1, and VthE is the threshold voltage of transistor M1.

Since M1 and M3 are coupled in series, the drain currents in M1 and M3 are equal. Combining equations (1) and (2), $$\frac{1}{2} \times \mu_p \times C_{ox} \times \frac{W_D}{L_D} \times (Vgs1 - V_{thD})^2 = \tag{3}$$

-continued $$\frac{1}{2} \times \mu_p \times C_{ox} \times \frac{W_E}{L_E} \times (Vgs3 - V_{thE})^2$$

As shown in FIG. 3, M3 has shorted gate and source, therefore, Vgs3=0. The gate-to-source voltage of the first enhancement-mode PMOS transistor M1 Vgs1 is denoted as Vo1. Therefore, equation (3) can be simplified as follows:

$$Vo1 = V_{thE} + \sqrt{\frac{W_D \times L_E}{W_E \times L_D}} \times V_{thD} \quad (4)$$

where:

VthE is the threshold voltage of the first enhancement-mode PMOS transistor M1, VthD is the threshold voltage of the first depletion-mode PMOS transistor M3, WE and LE are the gate width and gate length, respectively, of the enhancement-mode PMOS transistor M1; and WD and LD are the gate width and gate length, respectively, of first depletion-mode PMOS transistor M3.

It can be seen that that voltage drop between the voltage source VIN and node 301, Vo1, is a function of only threshold voltages, gate widths, and gate lengths of the first enhancement-mode PMOS transistor M1 and the first depletion-mode PMOS transistor M3. In other words, Vo1 is not a function of the voltage source VIN. Therefore, Vo1 can be used as a reference voltage. Moreover, equation (4) shows that Vo1 is a function of VthE and VthD, where VthE is the threshold voltage of enhancement-mode PMOS transistor M1, which has a negative temperature coefficient, and VthD is the threshold voltage of depletion-mode PMOS transistor M3, which has a positive temperature coefficient. Therefore, in embodiments of the invention, the gate widths and the gate lengths of the first enhancement-mode PMOS transistor M1 and the first depletion-mode PMOS transistor M3 can be selected such that the negative temperature coefficient and the positive temperature coefficient can be compensated, and such that the temperature coefficient of the reference voltage Vo1 is lowered to be within a preset limit.

As shown in FIG. 3, the first resistive device 311, with resistance value R1, is coupled between the voltage supply VIN and the source of the second depletion-mode PMOS transistor M7 at the first node 301. The second resistive device 312, with resistance value R2, has one end coupled to the drain of the second depletion-mode PMOS transistor M7 at a third node 303 and the other end coupled to the ground GND. Therefore, the same current flows through resistive devices 311 and 312. As shown in FIG. 3, Vo1 is the voltage across resistive device 311, and VOUT is the voltage across resistive device 312. As a result, the relationship between VOUT at node 303 and Vo1 can be expressed as follows.

$$VOUT = \frac{R_2}{R_1} \times Vo1 \quad (5)$$

Thus, a second reference voltage VOUT between the third node 303 and the ground is independent of the magnitude of the voltage supply. Further, a ratio of the second reference voltage and the first reference voltage is equal to a ratio of the resistance values of the first resistive device 311 and the second resistive device 312. Therefore, the value of the second reference voltage can be adjusted by changing the resistance values of R1 and R2. In some embodiments, resistive devices 311 and 312 can be physical resistors. In alternative embodiments, electronic devices that exhibits resistive behaviors, such as MOS transistors biased in the linear region, can also be used.

In some embodiments, voltage reference circuit 300 also includes an output resistance Rc coupled to node 303 and an output capacitor Cc coupled to output resistance Rc. In this configuration, Rc and Cc form an output filter circuit for reducing the noise in reference voltage VOUT.

As described above, embodiments of the present invention provide a voltage reference circuit having enhancement-mode and depletion-mode PMOS transistors, which provides a low-temperature coefficient adjustable reference voltage. The voltage reference circuit has many advantages over conventional E/D NMOS based voltage reference circuit. Depending on the embodiment, one or more of the following advantages may be realized. For example, the circuits described above can be fabricated using standard CMOS process technology, and the threshold implant in the channel region of the depletion mode PMOS transistors can be carried out and share the same mask as the implant mask for high value resistors. In contrast, forming depletion-mode NMOS transistors would need an extra masking step, thus increasing the cost. As another example, the voltage reference circuit is configured to operate in a large supply voltage range. The bias circuit described above, which includes a depletion-mode PMOS transistor and two enhancement-mode NMOS transistors, maintains depletion-mode PMOS M3 in the saturation region with a large Vds even under a low voltage supply. Further, the depletion-mode PMOS transistor in the feedback circuit maintains enhancement-mode PMOS transistor M1 in the saturation region even under a low voltage supply. Therefore, the voltage reference circuit according to embodiments of the invention can operate with a supply voltage source of between 2V to 5V, greatly expanding its scope of application over conventional devices. The feedback circuit also provides a negative feedback loop to improve output stability. In addition, the reference voltage can be adjusted by varying the ratio of two high-value resistors which are part of the feedback and output biasing circuit.

While the above is a description of specific embodiments of the invention, the above description should not be taken as limiting the scope of the invention. Therefore, it is appreciated that the examples and embodiments described herein are for illustrative purposes only and that various modifications or changes in light thereof will be suggested to persons skilled in the art and are to be included within the spirit and purview of this application.

What is claimed is:

1. A voltage reference circuit, comprising:

a first enhancement-mode PMOS transistor, a first enhancement mode NMOS transistor, and a first depletion-mode PMOS transistor coupled in series between a voltage supply and a ground, wherein the first depletion-mode PMOS transistor has shorted gate and source;

a second depletion-mode PMOS transistor having a source coupled to the gate of the first enhancement PMOS transistor at a first node, the second depletion-mode PMOS transistor also having a gate coupled to a drain of the first enhancement-mode PMOS transistor at a second node, forming a feedback circuit;

a first resistive device coupled between the voltage supply and the first node;

a second resistive device, which has one end coupled to the drain of the second depletion-mode PMOS transistor at a third node and has the other end coupled to the ground; and a bias circuit coupled to a gate of the first enhancement-mode NMOS transistor;

wherein the first enhancement-mode PMOS transistor and the first depletion-mode PMOS transistor are configured to operate in saturation region, and a first reference voltage between the voltage supply and the first node is independent of the magnitude of the voltage supply.

2. The circuit of claim 1, wherein:

the first enhancement-mode PMOS transistor has a source coupled to the voltage supply;

the first enhancement-mode NMOS transistor has a drain coupled to the drain of the first enhancement-mode PMOS transistor at the second node; and the first depletion-mode PMOS transistor has a source and a gate coupled to a fourth node, the fourth node further coupled to a source of the first enhancement-mode NMOS transistor.

3. The circuit of claim 2, wherein the bias circuit includes a third depletion-mode PMOS transistor, a second enhancement-mode NMOS transistor, and a third enhancement-mode NMOS transistor coupled in series between the voltage supply and the ground, wherein:

the third depletion-mode PMOS transistor has shorted gate and source coupled to the voltage supply;

the second enhancement-mode NMOS transistor has a gate and a drain coupled the drain of the third depletion-mode PMOS transistor at a fifth node; and the third enhancement-mode NMOS transistor has a drain and a gate coupled to a source of third enhancement-mode NMOS transistor and the ground GND at a sixth node.

4. The circuit of claim 1, wherein the first reference voltage is a function of only threshold voltages, gate widths, and gate lengths of the first enhancement-mode PMOS transistor and the first depletion-mode PMOS transistor.

5. The circuit of claim 4, wherein the first reference voltage Vo1 is expressed by the following equation:

$$Vo1 = V_{thE} + \sqrt{\frac{W_D \times L_E}{W_E \times L_D}} \times V_{thD}$$

wherein:

VthE is the threshold voltage of the first enhancement-mode PMOS transistor,

VthD is the threshold voltage of the first depletion-mode PMOS transistor, $W_E$ and $L_E$ are the gate width and gate length, respectively, of the enhancement-mode PMOS transistor, and $W_D$ and $L_D$ are the gate width and gate length, respectively, of first depletion-mode PMOS transistor.

6. The circuit of claim 5, wherein the gate widths and the gate lengths of the first enhancement-mode PMOS transistor and the first depletion-mode PMOS transistor have values such that the negative temperature coefficient of the threshold voltage of the enhancement-mode PMOS transistor and the positive temperature coefficient of the threshold voltage of the depletion-mode PMOS transistor are compensated, and such that the temperature coefficient of the first reference voltage is within a preset limit.

7. The circuit of claim 1, wherein a second reference voltage between the third node and the ground is independent of the magnitude of the voltage supply.

8. The circuit of claim 7, wherein a ratio of the second reference voltage and the first reference voltage is equal to a ratio of the resistance values of the first resistive device and the second resistive device.

9. The circuit of claim 1, wherein substrates of the first, the second, and the third depletion-mode PMOS transistors are coupled to the voltage supply, and substrates of the first, the second, and the third enhancement-mode NMOS transistors are coupled to the ground.

10. A voltage reference circuit, comprising:

a first enhancement-mode PMOS transistor, a first enhancement mode NMOS transistor, and a first depletion-mode PMOS transistor coupled in series between a voltage supply and a ground, wherein:

the first enhancement-mode PMOS transistor has a source coupled to the voltage supply;

the first enhancement-mode NMOS transistor has a drain coupled to the drain of the first enhancement-mode PMOS transistor;

the first depletion-mode PMOS transistor M3 has a source and a gate coupled to a source of the first enhancement-mode NMOS transistor;

a second depletion-mode PMOS transistor having a source coupled to the gate of the first enhancement PMOS transistor Ml at a first node, the second depletion-mode PMOS transistor also having a gate coupled to a drain of the first enhancement-mode PMOS transistor at a second node, forming a feedback loop;

a first resistive device coupled between the voltage supply and the source of the second depletion-mode PMOS transistor;

a second resistive device, which has one end coupled to the drain of the second depletion-mode PMOS transistor M7 at a third node and has the other end coupled to the ground;

the first depletion-mode PMOS transistor coupled to the first enhancement-mode NMOS transistor at a fourth node; and a bias circuit coupled to a gate of the first enhancement-mode NMOS transistor M2 at a fifth node, the bias circuit configured to maintain the first depletion-mode PMOS transistor to operate in saturation region, wherein the bias circuit includes a third depletion-mode PMOS transistor, a second enhancement-mode NMOS transistor, and a third enhancement-mode NMOS transistor coupled in series between the voltage supply and the ground, wherein:

the third depletion-mode PMOS transistor has a source and a gate coupled to the voltage supply;

the second enhancement-mode NMOS transistor has a gate and a drain coupled the drain of the third depletion-mode PMOS transistor and coupled to the gate of the first enhancement-mode MOS transistor and at a fifth node; and the third enhancement-mode NMOS transistor has a drain and a gate coupled to a source of third enhancement-mode NMOS transistor and the ground GND at a sixth node;

wherein the voltage reference circuit is configured to provide a first reference voltage between the voltage supply at the first node, and a second reference voltage between the third node and the ground, wherein the first and the second reference voltage are independent of the voltage supply, and a temperature coefficient of the first reference voltage is within a preset limit.

11. The circuit of claim 10, wherein the first reference voltage is a function of only threshold voltages, gate widths, and gate lengths of the first enhancement-mode PMOS transistor and the first depletion-mode PMOS transistor.

12. The circuit of claim 11, wherein the first reference voltage is expressed by the following equation:

$$Vo1 = V_{thE} + \sqrt{\frac{W_D \times L_E}{W_E \times L_D}} \times V_{thD}$$

wherein:

VthE is the threshold voltage of the first enhancement-mode PMOS transistor,

VthD is the threshold voltage of the first depletion-mode PMOS transistor, $W_E$ and $L_E$ are the gate width and gate length, respectively, of the enhancement-mode PMOS transistor; and $W_D$ and $L_D$ are the gate width and gate length, respectively, of first depletion-mode PMOS transistor.

13. The circuit of claim 12, wherein the gate widths and the gate lengths of the first enhancement-mode PMOS transistor and the first depletion-mode PMOS transistor are selected such that the negative temperature coefficient of the threshold voltage of the enhancement-mode PMOS transistor and the positive temperature coefficient of the threshold voltage of the depletion-mode PMOS transistor are compensated and such that the temperature coefficient of the first reference voltage is within a preset limit.

14. The circuit of claim 10, wherein a second reference voltage between the third node and the ground is independent of the magnitude of the voltage supply.

15. The circuit of claim 14, wherein a ratio of the second reference voltage and the first reference voltage is equal to a ratio of the resistance values of the first resistive device and the second resistive device.

16. The circuit of claim 10, wherein substrates of the first, the second, and the third depletion-mode PMOS transistors are coupled to the voltage supply, and substrates of the first, the second, and the third enhancement-mode NMOS transistors are coupled to the ground.

17. A voltage reference circuit, comprising:

a first enhancement-mode PMOS transistor, a first enhancement mode NMOS transistor, and a first depletion-mode PMOS transistor coupled in series between a voltage supply and a ground;

a first resistive device, a feedback device, and a second resistive device coupled in series between the voltage supply and the ground, wherein the feedback device is coupled to the first enhancement PMOS transistor to form a feedback circuit; and a bias circuit coupled to a gate of the first enhancement-mode NMOS transistor;

wherein the first enhancement-mode PMOS transistor and the first depletion-mode PMOS transistor are configured to operate in saturation region;

wherein a first reference voltage across the first resistive device and a second reference voltage across the second resistive device are configured to be independent of the magnitude of the voltage supply and have temperature coefficients within a preset limit.

18. The circuit of claim 17, wherein:

the feedback device comprises a second depletion-mode PMOS transistor having a source coupled to the gate of the first enhancement PMOS transistor at a first node, the second depletion-mode PMOS transistor also having a gate coupled to a drain of the first enhancement-mode PMOS transistor at a second node, forming the feedback circuit;

the first depletion-mode PMOS transistor has shorted gate and source;

the first resistive device is coupled between the voltage supply and the first node; and the second resistive device has one end coupled to the drain of the second depletion-mode PMOS transistor at a third node and has the other end coupled to the ground; and wherein the voltage reference circuit is configured to provide the first reference voltage between the voltage supply and the first node, and the second reference voltage between the third node and the ground.

19. The circuit of claim 18, wherein:

the first enhancement-mode PMOS transistor has a source coupled to the voltage supply;

the first enhancement-mode NMOS transistor has a drain coupled to the drain of the first enhancement-mode PMOS transistor at the second node; and the first depletion-mode PMOS transistor has a source and a gate coupled to a fourth node, the fourth node further coupled to a source of the first enhancement-mode NMOS transistor.

20. The circuit of claim 18, wherein the bias circuit includes a third depletion-mode PMOS transistor, a second enhancement-mode NMOS transistor, and a third enhancement-mode NMOS transistor coupled in series between the voltage supply and the ground, wherein:

the third depletion-mode PMOS transistor has shorted gate and source coupled to the voltage supply;

the second enhancement-mode NMOS transistor has a gate and a drain coupled the drain of the third depletion-mode PMOS transistor at a fifth node; and the third enhancement-mode NMOS transistor has a drain and a gate coupled to a source of third enhancement-mode NMOS transistor and the ground GND at a sixth node.

21. The circuit of claim 18, wherein the first reference voltage is expressed by the following equation:

$$Vo1 = V_{thE} + \sqrt{\frac{W_D \times L_E}{W_E \times L_D}} \times V_{thD}$$

wherein:

VthE is the threshold voltage of the first enhancement-mode PMOS transistor,

VthD is the threshold voltage of the first depletion-mode PMOS transistor, $W_E$ and $L_E$ are the gate width and gate length, respectively, of the enhancement-mode PMOS transistor; and $W_D$ and $L_D$ are the gate width and gate length, respectively, of first depletion-mode PMOS transistor.

* * * * *